United States Patent
Lauer et al.

(10) Patent No.: US 9,224,604 B2
(45) Date of Patent: Dec. 29, 2015

(54) DEVICE AND METHOD FOR FORMING SHARP EXTENSION REGION WITH CONTROLLABLE JUNCTION DEPTH AND LATERAL OVERLAP

(75) Inventors: Isaac Lauer, Yorktown Heights, NY (US); Effendi Leobandung, Wappingers Falls, NY (US); Ghavam G. Shahidi, Pound Ridge, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 717 days.

(21) Appl. No.: 13/440,546

(22) Filed: Apr. 5, 2012

(65) Prior Publication Data
US 2013/0264612 A1    Oct. 10, 2013

(51) Int. Cl.
```
H01L 21/20      (2006.01)
H01L 21/36      (2006.01)
H01L 21/265     (2006.01)
H01L 21/306     (2006.01)
H01L 21/3065    (2006.01)
H01L 29/66      (2006.01)
H01L 29/78      (2006.01)
```

(52) U.S. Cl.
CPC .... *H01L 21/26506* (2013.01); *H01L 21/26586* (2013.01); *H01L 21/3065* (2013.01); *H01L 21/30604* (2013.01); *H01L 29/6659* (2013.01); *H01L 29/66636* (2013.01); *H01L 29/66492* (2013.01); *H01L 29/66545* (2013.01); *H01L 29/7833* (2013.01)

(58) Field of Classification Search
CPC ............ H01L 21/265; H01L 21/26506; H01L 21/26513; H01L 21/26586; H01L 29/66636; H01L 29/6659; H01L 29/66492; H01L 29/7833

USPC ............. 438/128, 129, 197, 164, 412, 41, 42, 438/39, 44, 300, 429; 257/204, 288, 352, 257/353, 354, 507
See application file for complete search history.

(56) References Cited

U.S. PATENT DOCUMENTS

| | | |
|---|---|---|
| 6,265,293 B1 | 7/2001 | Yu |
| 6,355,543 B1 | 3/2002 | Yu |
| 6,391,731 B1 | 5/2002 | Chong et al. |
| 6,605,498 B1 | 8/2003 | Murthy et al. |
| 6,815,770 B1 | 11/2004 | Chien et al. |
| 7,112,499 B2 | 9/2006 | Poon et al. |
| 7,157,356 B2 | 1/2007 | Henson et al. |
| 7,642,150 B2 | 1/2010 | Arevalo et al. |

(Continued)

OTHER PUBLICATIONS

Lauer, I., et al. "Device and Method for Forming Sharp Extension Region With Controllable Junction Depth and Lateral Overlap" Office Action dated May 7, 2013 for U.S. Appl. No. 13/611,387. (10 Pages).

(Continued)

*Primary Examiner* — Thanh Y Tran
(74) *Attorney, Agent, or Firm* — David A. Cain; Hoffman Warnick LLC

(57) ABSTRACT

A method for forming a semiconductor device includes forming a gate stack on a monocrystalline substrate. A surface of the substrate adjacent to the gate stack and below a portion of the gate stack is amorphorized. The surface is etched to selectively remove a thickness of amorphorized portions to form undercuts below the gate stack. A layer is epitaxially grown in the thickness and the undercuts to form an extension region for the semiconductor device. Devices are also provided.

20 Claims, 6 Drawing Sheets

(56) References Cited

U.S. PATENT DOCUMENTS

| | | |
|---|---|---|
| 7,741,200 B2 | 6/2010 | Cho et al. |
| 7,879,667 B2 | 2/2011 | Mowry et al. |
| 8,253,204 B2 | 8/2012 | Lee et al. |
| 2003/0098479 A1 | 5/2003 | Murthy et al. |
| 2004/0147070 A1* | 7/2004 | Lei et al. ............ 438/199 |
| 2004/0248369 A1 | 12/2004 | Wang et al. |
| 2006/0076627 A1 | 4/2006 | Chen et al. |
| 2006/0131665 A1 | 6/2006 | Murthy et al. |
| 2006/0258072 A1* | 11/2006 | Kavalieros et al. ........ 438/197 |
| 2007/0228417 A1 | 10/2007 | Yasutake |
| 2007/0267703 A1 | 11/2007 | Chong et al. |
| 2009/0035911 A1* | 2/2009 | Rachmady et al. ........ 438/300 |
| 2009/0050965 A1 | 2/2009 | Okamoto |
| 2010/0148217 A1 | 6/2010 | Simonelli et al. |
| 2011/0147828 A1 | 6/2011 | Murthy et al. |

OTHER PUBLICATIONS

Lauer, I., et al. "Device and Method for Forming Sharp Extension Region With Controllable Junction Depth and Lateral Overlap" Final Office Action dated Nov. 22, 2013 for U.S. Appl. No. 13/611,387. (9 Pages).

Non-Final Office Action issued in U.S. Appl. No. 13/611,387 on Jun. 18, 2014. (25 Pages).

* cited by examiner

DEVICE AND METHOD FOR FORMING SHARP EXTENSION REGION WITH CONTROLLABLE JUNCTION DEPTH AND LATERAL OVERLAP

BACKGROUND

1. Technical Field

The present invention relates to semiconductor processing, and more particularly to devices and methods for forming accurate extension diffusion regions that include a controllable junction depth and have a lateral overlap into a channel region.

2. Description of the Related Art

As dimension size diminishes for semiconductor processing, dimensional restrictions are more difficult to achieve and verify. For example, processing activities like doping a substrate may often lead to dopants existing in unwanted areas. This is particularly true in a channel region of field effect transistors. The field effect transistors often undergo a plurality of doping or implantation steps. These may include forming a channel below a gate, forming halo diffusion regions, forming diffusion regions for sources and drains and extending the source and drain diffusion regions below the gate electrodes (extensions).

In many instances, these diffusion steps can cause surface damage to a surface of a semiconductor substrate. In addition the uncertainties related to the diffusion steps, related etching steps are difficult to control as well. Diffusion regions and related structure are therefore difficult to maintain and control dimensionally during and after processing. With shallow junctions, these difficulties are amplified given the smaller sizes involved.

SUMMARY

A method for forming a semiconductor device includes forming a gate stack on a monocrystalline substrate. A surface of the substrate adjacent to the gate stack and below a portion of the gate stack is amorphized. The surface is etched to selectively remove a thickness of amorphized portions to form undercuts below the gate stack. A layer is epitaxially grown in the thickness and the undercuts to form an extension region for the semiconductor device.

In another embodiment, a method for forming a semiconductor device includes forming a gate stack on a monocrystalline substrate; implanting an inert species to form an amorphous phase of the monocrystalline substrate on a surface of the substrate adjacent to the gate stack and below a portion of the gate stack, an amorphized region is formed having a controlled depth by adjusting a power of implantation species; etching the surface to selectively remove a thickness of the amorphized regions and to form undercuts below the gate stack; and epitaxially growing a layer in the thickness and the undercuts to form an extension region for the semiconductor device.

A semiconductor device includes a gate electrode formed on a monocrystalline substrate over a channel region. Extension diffusion layers are formed by crystal growth on top of a surface of the monocrystalline substrate on opposing sides of the channel region. Each extension diffusion layer having a portion extending into an undercut formed below the gate electrode. Source and drain diffusion regions are formed in contact with the extension diffusion layers.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
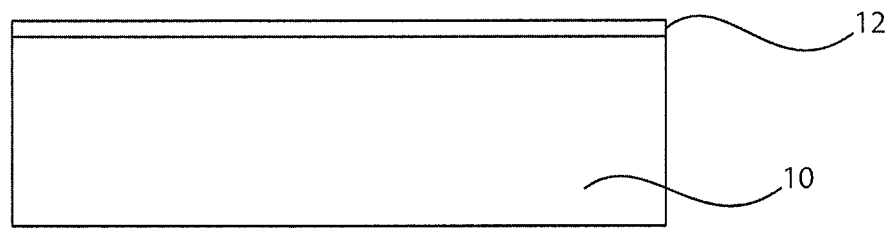
FIG. 1 is a cross-sectional view of a substrate having an insulating layer formed thereon in accordance with the present principles.

In accordance with the present principles, devices and methods are provided that permit the formation of sharper diffusion regions. This means that the diffusion regions may be formed with greater control, dimensional accuracy and repeatability. Diffusion regions formed in accordance with the present principles have a profile that can be controlled in depth to provide shallower highly doped diffusion regions.

In one embodiment, extension regions are formed in accordance with the present principles. An extension diffusion region extends below a gate electrode to provide conductivity to a channel below the gate electrode. For this, it is desirable that the extension diffusion regions extend or overlap the channel below the gate electrode (from both sides of the gate). After forming a gate structure on a substrate, an implantation process is employed to damage the substrate. A depth of the damage is well-controlled by controlling the energy of the implantation species. In one embodiment, a screen film may be formed to adjust the depth of the implantation damage. The implantation process may be carried out at an angle to achieve lateral damage below the gate structure.

An etching process is employed to selectively etch away the damaged material leaving an exposed surface of the substrate suitable for regrowing an extension region. The extension region may be epitaxial grown and even extends below the gate structure. Due to the control provided by the implantation process, the extension regions are dimensionally accurate and sharp as compared to prior art processes.

It is to be understood that the present invention will be described in terms of a given illustrative architecture on a semiconductor wafer; however, other architectures, structures, substrate materials and process features and steps may be varied within the scope of the present invention. The present principles may be applied to any field effect transistor structures or any semiconductor device employing a diffusion region.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a substrate 10 is shown for forming a semiconductor device in accordance with the present principles. The substrate 10 may include a bulk monocrystalline silicon substrate, a silicon-on-insulator substrate, a silicon germanium substrate, other silicon-containing compounds, etc. or may include other substrate materials. Substrate 10 preferably includes a crystalline form of silicon suitable for forming semiconductor devices and in particular conductive channels of the semiconductor devices. The substrate 10 may be doped to form wells for proper transistor operation. The wells are doped with the appropriate species to provide proper operation of different transistor types.

The substrate 10 has a thin insulator or gate dielectric 12 formed thereon. If the substrate includes silicon, the insulator 12 includes a native oxide ($SiO_2$). This may include a few nanometers (0.5-20 nm) of oxide. The native oxide 12 may be sufficient for a gate oxide or insulator as will be described.

Figure 2:
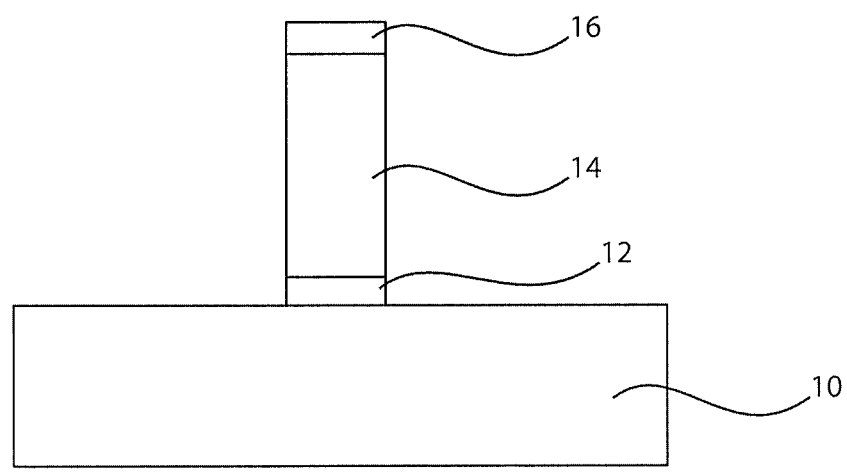
FIG. 2 is a cross-sectional view of the substrate having a gate stack (including one of a dummy gate electrode or a conductive electrode) formed thereon including a portion of the insulating layer as a gate dielectric in accordance with the present principles.

Referring to FIG. 2, a gate conductor or a dummy gate material 14 is deposited over the insulator 12. The gate conductor or dummy gate material 14 may include polysilicon, or doped polysilicon, although other materials may be employed. The polysilicon may be deposited using a chemical vapor deposition (CVD) process. Other materials and processes may be employed to form the gate conductor 14. A hard mask 16 is deposited over the gate conductor 14. The hard mask 16 may be patterned using lithographic techniques. In one embodiment, a photoresist (not shown) may be formed on the hard mask 16, exposed to radiation using a mask for selective curing and developed to leave behind a cross-linked pattern. The cross-linked pattern is then employed as an etch mask for patterning the hard mask 16.

Hard mask 16 includes a material that is employed to selectively etch the gate conductor 14. In one embodiment, the hard mask 16 includes a silicon nitride, a silicon oxynitride, or other material. The hard mask 16 is opened up to define a pattern for forming the gate conductors 14. A reactive ion etch (RIE) may be employed to form the gate conductors 14 and etch down through the insulator 12 to the substrate 10.

Figure 3:
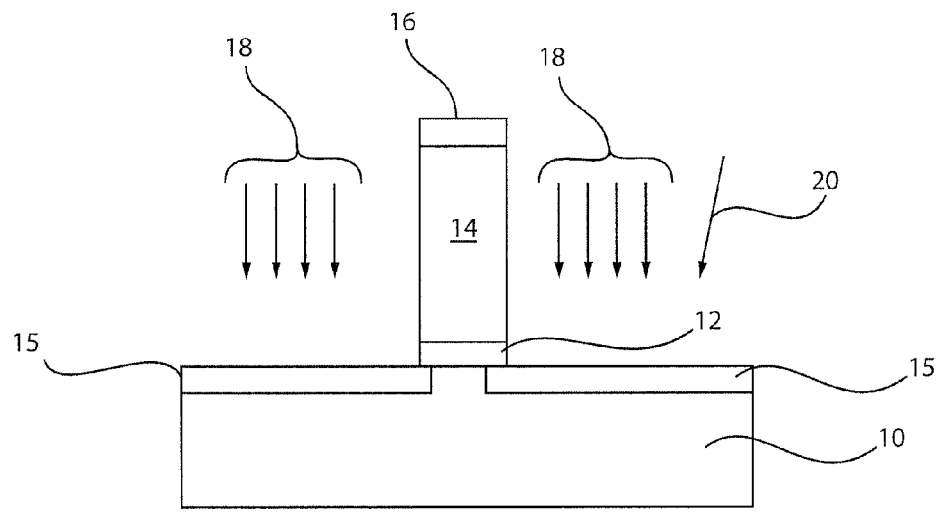
FIG. 3 is a cross-sectional view of the substrate having a surface amorphized by implantation in accordance with one embodiment.

Referring to FIG. 3, an implantation process is performed to amorphize a shallow depth of an exposed surface of the substrate 10. The implantation process may include a high dose bombardment of the substrate 10 with an inert species 18, such as, e.g., Ge or Xe. A high dose may include a dose of between about $1 \times 10^{13}$ to about $1 \times 10^{18}$, preferably the dose is about $1 \times 10^{15}$. The energy for the implantation determines a depth of implantation into the substrate 10. This forms an amorphorization region or layer 15.

In one illustrative embodiment, if Ge is employed, a 5 keV implantation energy may be employed for the process. This results in an average implantation depth of between about 10 nm and 20 nm. In another illustrative embodiment, if Xe is employed, an 8 keV implantation energy may be employed. This results in an average implantation depth of between about 10 nm and 20 nm.

In one embodiment, the implantation of inert species 20 occurs at an angle to provide implantation species below the gate conductor 14. The angle may be between about 5 degrees and about 20 degrees although other angles may be selected. The angled implantation needs to occur on both sides of the gate conductor 14. In this way, the amorphized region 15 is formed below the gate conductor 14 on both sides.

In one embodiment, the amorphorization region 15 is formed on monocrystalline silicon of substrate 10. The monocrystalline silicon lattice is disrupted by the implantation process and forms an amorphous silicon. The amorphous silicon has different physical properties than the monocrystalline silicon of the remaining portions of the substrate 10. These differences in physical properties are exploited in subsequent steps to selectively remove the amorphous silicon of region 15 with respect to substrate 10. It should be understood that the damage imparted by the implantation may be performed in other ways. For example, a chemical process, elemental diffusion into the surface of the substrate, etc. may be performed to damage or change the characteristics of the region 15 to permit selective removal thereof.

Figure 4:
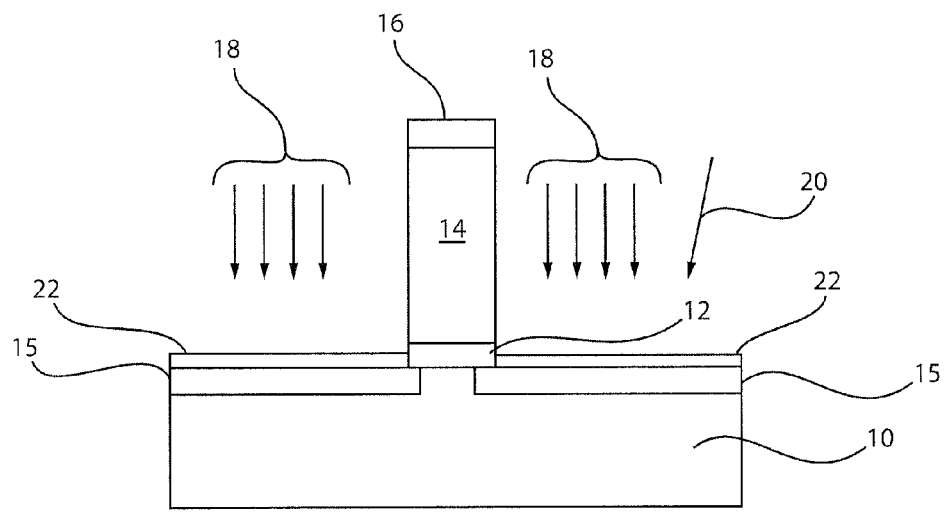
FIG. 4 is a cross-sectional view of the substrate having a surface amorphized by implantation through a screen film to adjust and control a depth of the implantation and amorphization in accordance with another embodiment.

Referring to FIG. 4, an alternate implantation process may be performed to amorphize a shallow depth of an exposed surface of the substrate 10 in accordance with an alternate embodiment. This implantation process may include a high dose bombardment of the substrate 10 with an inert species 18, such as, e.g., Ge or Xe. As before the high dose may include a dose of between about $1 \times 10^{13}$ to about $1 \times 10^{18}$, preferably the dose is about $1 \times 10^{15}$. The energy for the implantation determines a depth of implantation into the substrate 10. In this embodiment, a screen film 22 is formed over the exposed substrate regions to add depth to target areas. The screen film 22 may have its thickness adjusted to adjust the depth of the implantation species 18 (or 20). A deposition process for forming the screen film 22 can provide a conformal film with a very accurate thickness across an entire wafer. This is especially the case for thicknesses of less than about one micron. The screen film 22 may include a dielectric material such as silicon dioxide, silicon nitride, silicon oxynitride, or other material. The material of the screen film 22 may remain and be removed during spacer film formation (FIG. 5).

Use of the screen film 22 results in a shallower amorphorization layer 15 if comparable energies are employed. Since the implantation depth is increased by the screen film 16, the amorphorization layer 14 is not as deep. Alternately, the screen film 16 can enable the use of different implantation species and/or different implantation energies. If, for example, Ge is employed a 5 keV energy may be employed. This results in an average implantation depth of between about 10 nm and 20 nm minus the thickness of the screen film 16. In another illustrative embodiment, if Xe is employed and an 8 keV implantation energy is employed. The average implantation depth is between about 10 nm and 20 nm minus the thickness of the screen film 16.

The implantation of inert species 20 may be performed at an angle to provide implantation species below the gate conductor 14 as described above. The angle may be between about 5 degrees and about 20 degrees although other angles may be selected. The angled implantation preferably needs to occur on both sides of the gate conductor 14. In this way, the amorphorized region 15 is formed below the gate conductor 14 on both sides.

Figure 5:
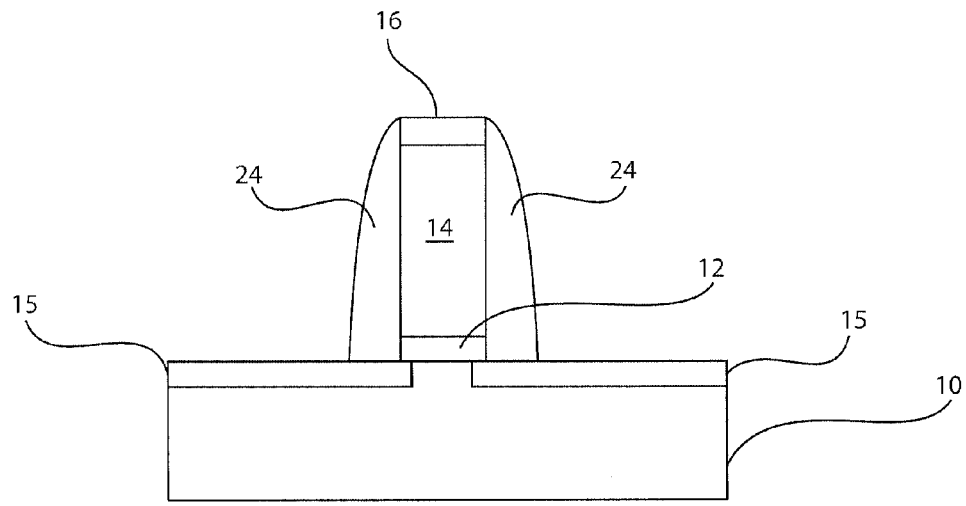
FIG. 5 is a cross-sectional view of the substrate having the surface amorphized and includes sidewall spacers formed on the gate stack in accordance with one embodiment.

Referring to FIG. 5, a deposition and etch is performed to form spacers 24. In one embodiment, the spacer deposition is performed in a low temperature deposition process. Low temperature includes a temperature below 200 degrees C. The low temperature processing saves thermal budget and helps to preserve structures that have already been formed. The material of the spacers 24 may include a silicon nitride, a silicon oxynitride, or other dielectric material. Spacers 24 further extend over the amorphorization regions 15. The amorphorization regions 15 extend below the gate insulator 12 and the spacers 24. The spacers 24 provide protection for the gate conductor 14 in subsequent steps.

Sidewall spacers 24 may be formed by depositing a conformal layer over a surface of the gate structure having vertical and horizontal surface regions followed by performing a directional RIE in the vertical direction (dry etching) to remove the conformal material from horizontal surfaces at a much faster rate than from the vertical surfaces. The screen film 22, if employed, is etched away during this etching process.

Figure 6:
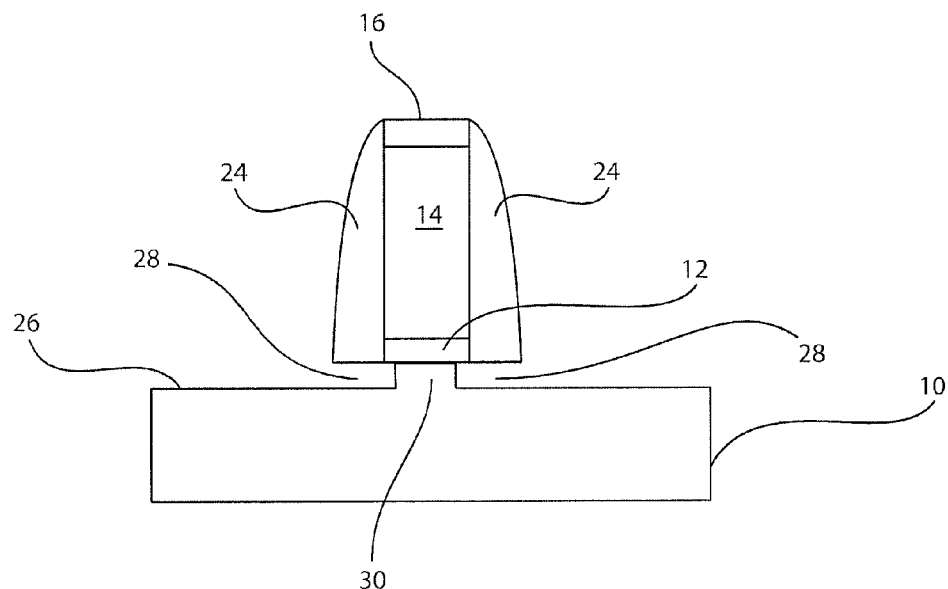
FIG. 6 is a cross-sectional view of the substrate having the amorphized surface etched away by a selective etching process that removes amorphized material selective to the substrate in accordance with one embodiment.

Referring to FIG. 6, a selective removal of the amorphorization regions 15 is performed. The selective removal may include a chemical etch process that selectively removes the amorphorization material of region 15 with respect to the substrate 10, in particular, as well as, the spacers 24 and the gate insulator 12 in undercut regions 28. The undercut regions 28 extend below the gate insulator 12 and the spacers 24 to expose sides of a channel region 30. Due to the amorphorization of the material in region 15, a clean and sharp removal of the amorphorization material is achieved. Region 15 may include a depth of, e.g., about 10 nm. This results in a shallow and uniform depth for the undercut regions 28 and a clean and unmarred surface 26 of the substrate 10. In one embodiment, the chemical etch process includes and a wet etch, such as, e.g., an $NH_4OH$ etch. The $NH_4OH$ etch may be tuned to increase the selectivity of the etch of the amorphorization material of regions 15 relative to the surface 26 of the substrate 10. The tuning of the etch may include an adjustment to an amount of dilution, a temperature of the etch, a duration of the etch, etc. In another embodiment, an HCl baked process is employed to remove the amorphorization material of regions 15. This includes exposing the amorphorization material of regions 15 to HCl and baking at a temperature of between about 600 degrees C. and about 800 degrees C. for about 10 minutes. The HCl etch may be tuned to increase the selectivity of the etch of the amorphorization material of regions 15 relative to the surface 26 of the substrate 10. The tuning of the etch may include an adjustment to an amount of dilution, a temperature of the etch, a duration of the etch, etc.

Figure 7:
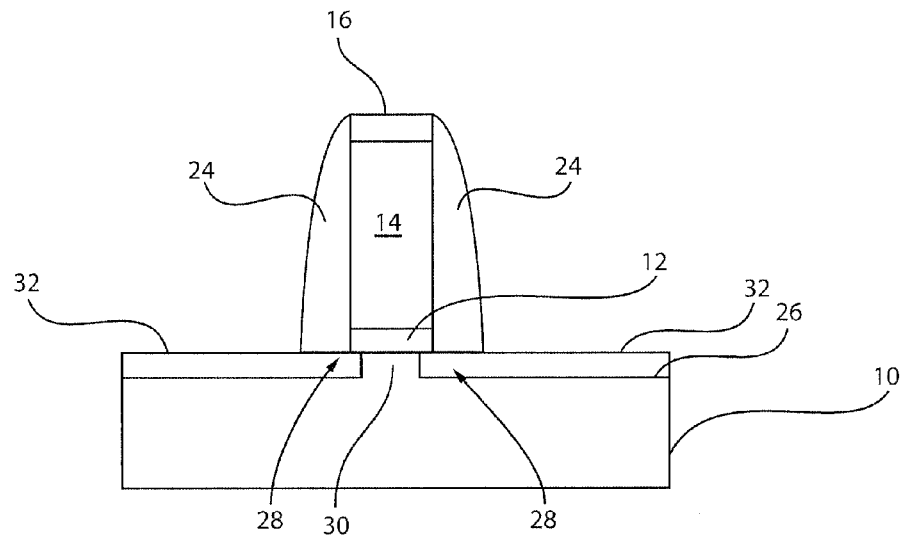
FIG. 7 is a cross-sectional view of the substrate having an epitaxially grown layer that forms an extension diffusion region in accordance with the present principles.

Referring to FIG. 7, with the exposure of surface 26 due to the etching process described above, extension layers 32 may be grown on the surface 26. The extension layers 32 may be grown using an epitaxial growth process. In one embodiment, the substrate 10 includes monocrystalline silicon, and the epitaxial growth continues the monocrystalline structure, which is rebuilt from the surface 26 up to a height of the spacers 24. The epitaxial growth fills in the undercuts 28 to contact the channel region 30. The epitaxial growth may be performed without in-situ dopant sources or with in-situ dopant sources.

In one embodiment, the extension layers 32 are formed without in-situ doping. An n-type field effect transistor (NFET) employs n-type dopants and a p-type field effect transistor (PFET) employs p-type dopants. Upon formation of the extension layers 32, NFETs or PFETs are first masked and the other of the NFETs or PFETs is doped with and appropriate dose and species. Then, the mask is removed and another mask is placed over the doped NFETs or doped PFETs. The other of the NFETs or PFETs is doped with and appropriate dose and species. The doping may include an ion implantation process. Alternately, a diffusion layer may be deposited followed by an anneal to drive-in dopants. Other techniques may also be employed.

In a particularly useful embodiment, the epitaxial deposition process includes a dopant source which provides dopants to the extension layers 32 during the epitaxial growth. The epitaxial growth may be carried separately using masks for NFETs and PFETs, as described above. For NFETs, an n-type dopant source may be included in the epitaxial growth process, to regrow the substrate 10 to form extension diffusion regions for NFETs. For PFETs, a p-type dopant source may be included in the epitaxial growth process, to regrow the substrate 10 to form extension diffusion regions for PFETs.

Since the extension layers 32 are grown with the dopants, the layers 32 are uniformly doped. In this way, the extension regions for a transistor device 40 formed in accordance with the present principles include regrown extension layers 32 instead of diffusion regions formed directly in the substrate 10. The extension layers 32 are formed with great dimensional accuracy, extend below the gate conductor 14, have uniform doping concentrations and have a thickness that is well-controlled.

Figure 8:
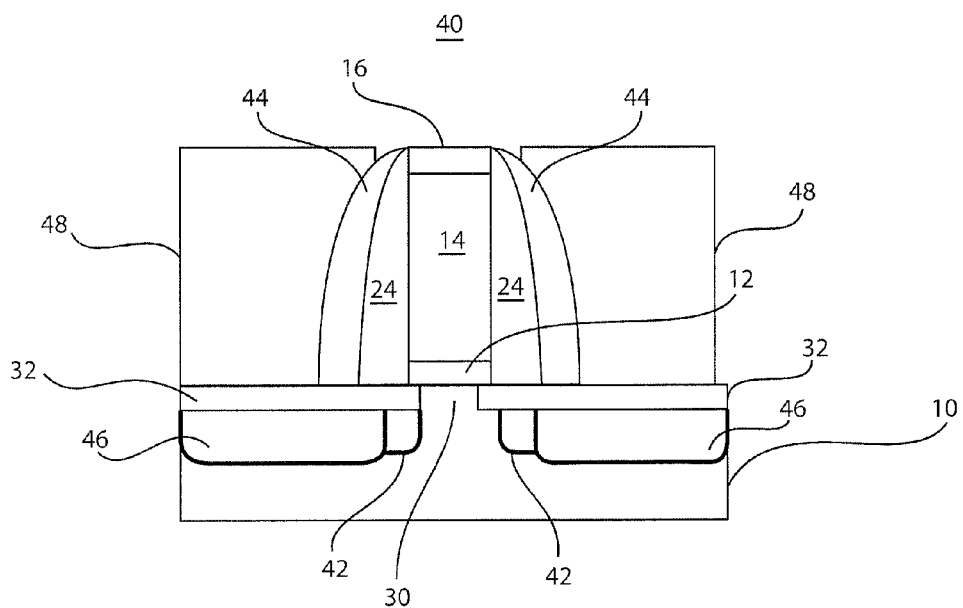
FIG. 8 is a cross-sectional view of a device formed in accordance with the present principles having an epitaxially grown layer that forms an extension diffusion region.

Referring to FIG. 8, processing may continue with known processing techniques. This may include the formation of halo implants 42. The halo implants 42 are formed by implanting dopants through the extension layers 32. It should be understood that the halo dopants may be implanted before the formation of the extension layers 32. It is further noted that other structures and steps as described herein may be reordered as needed.

A second spacer 44 may be formed by a similar process as described above for spacers 24. Source/drain (S/D) diffusion regions 46 are formed by implanting dopants into the substrate 10. It should be understood that the S/D diffusion regions 46 may be formed as raised diffusion regions on top of the extension layers 32. In this way, the S/D diffusion regions 46 can be epitaxially grown while reducing implantation damage to the extension layers 32. Otherwise, the implantation of the S/D diffusion regions 46 is carried out through the extension layers 32.

Instead of a rapid thermal anneal (RTA) to activate the dopants in the various regions. A flash or laser anneal may be employed. The flash anneal provides a flash of radiation over an entire wafer to activate the dopants. The laser anneal includes pinpoint laser radiation incident on each diffusion region to activate the dopants.

It should be understood, that after ion implantation and prior to activation anneals that the atoms of implanted species are located interstitially in the silicon crystal lattice and only become active as donors and acceptors after the anneal moves the dopant atoms into lattice positions previously occupied by silicon atoms.

Additional processing may include silicidation of the S/D diffusion regions 46 and the formation of middle of the line (MOL) structures, such as, interlevel dielectric layers, self-aligned contacts 48, and end of the line (EOL) structures, such as metal lines, etc. In one embodiment, the gate conductor 14 may have included a dummy structure. The dummy structure provides a place holder for the actual gate through difficult processing steps. In this way, the gate conductor may be installed to replace the dummy gate without damage to the gate conductor. The gate conductor 14 may be provided initially if the gate structure remains sufficiently intact throughout the processing.

Figure 9:
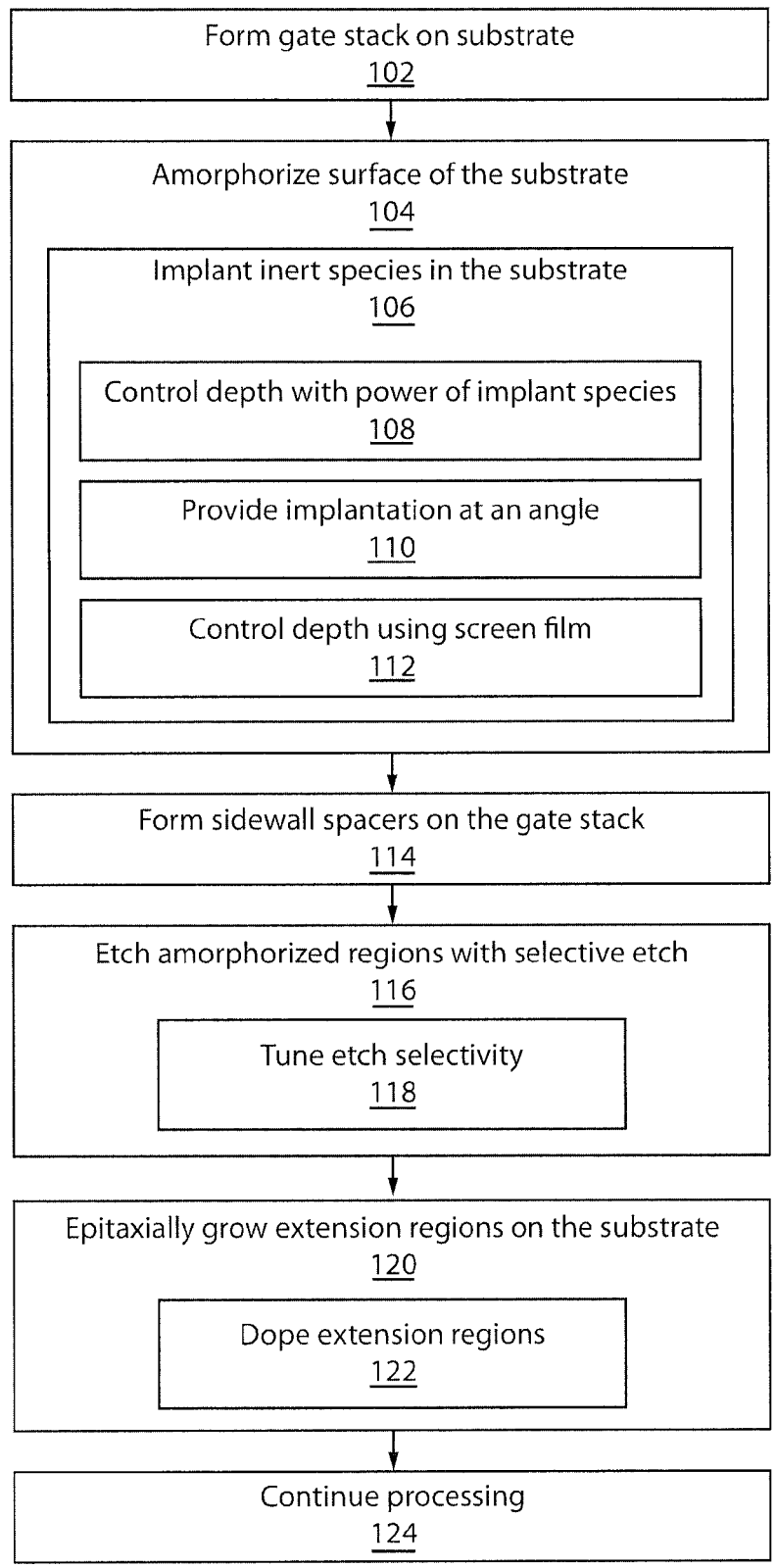
FIG. 9 is a block/flow diagram showing a method for forming a device having an epitaxially grown layer that forms an extension diffusion region in accordance with the present principles.
Figure 10:
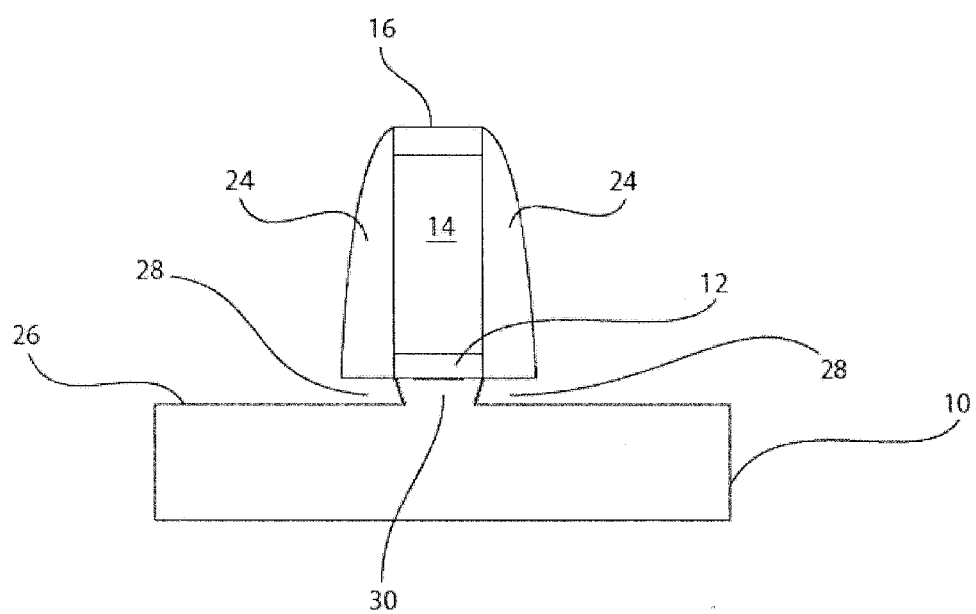
FIG. 10 is a cross-sectional view of the substrate having the amorphized surface etched away by a selective etching process that removes amorphized material selective to the substrate in accordance with one embodiment.

Referring to FIG. 9, a method for forming a semiconductor device is shown in accordance with illustrative embodiments. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved.

In block 102, a gate stack is formed on a monocrystalline substrate. The gate stack may include a dummy gate structure or may include a gate electrode that will be employed in the final transistor device to be formed. In block 104, a surface of the substrate adjacent to the gate stack and below a portion of the gate stack is amorphorized. In one embodiment, the substrate includes silicon, and the amorphorized material includes amorphous silicon (a-Si). In block 106, the amorphorizing includes implanting an inert species to form an amorphous phase of the monocrystalline substrate. The inert species may include, e.g., Ge and Xe. Other species may also be employed, e.g., Si, etc.

In block 108, a depth of an amorphorized region can be controlled by adjusting a power of implantation species. This creates a well-defined depth of implantation making the features of the amorphorized region sharp, which will eventually translate into well-defined boundaries of a final extension diffusion region. In block 110, the implantation of the inert species preferably occurs at an angle to amorphorize material below the gate stack (e.g., encroachment below the gate stack). The angle may be between about 5 degrees and about 20 degrees relative to a sidewall of the gate stack. Other angles may be employed as well.

In block 112, the depth of the amorphorized region may also be controlled by forming a screen film on areas of the monocrystalline substrate adjacent to the gate stack to adjust a depth of the amorphorizing of the surface.

In block 114, sidewall spacers are formed on the gate stack. This may include a low temperature process. For example, a temperature below 200 degrees Celsius may be employed after the amorphorizing step to form the sidewall spacers.

In block 116, the surface is etched to selectively remove a thickness of amorphorized portions and to form undercuts below the gate stack. The etch process may include wet etching with an $NH_4OH$ or an HCl baked process to selectively etch the amorphorized portions with respect to the monocrystalline substrate. In block 118, the etching may be tuned to increase the selectivity of the etch process.

In block 120, a layer is epitaxially grown in the thickness and the undercuts to form an extension region(s) for the semiconductor device. In block 122, the epitaxially grown layer may be doped by in-situ doping during growth of the layer. Other doping methods may also be employed. In block 124, processing continues with the formation of halo diffusion region formation, source/drain diffusion region formation, etc.

Having described preferred embodiments of a device and method for forming sharp extension regions with controllable junction depth and lateral overlap (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
   forming a gate stack on a monocrystalline substrate;
   amorphorizing a surface of the substrate adjacent to the gate stack and below a portion of the gate stack;
   etching the surface to selectively remove a thickness of amorphorized portions to form undercuts underneath the gate stack, such that the undercuts are angled, where lower portions of the undercuts extend horizontally farther underneath the gate electrode than upper portions of the undercuts; and
   epitaxially growing a layer in the thickness and the undercuts to form an extension region for the semiconductor device.

2. The method as recited in claim 1, wherein the amorphorizing a surface of the substrate includes implanting an inert species to form an amorphous phase of the monocrystalline substrate.

3. The method as recited in claim 2, wherein the inert species include one of Ge or Xe.

4. The method as recited in claim 1, wherein amorphorizing a surface of the substrate includes controlling a depth of an amorphorized region by adjusting a power of implantation species.

5. The method as recited in claim 1, wherein the amorphorizing a surface of the substrate includes implanting an inert species at an angle to amorphorize material below the gate stack.

6. The method as recited in claim 1, wherein the angle is between about 5 degrees and about 20 degrees relative to a sidewall of the gate stack.

7. The method as recited in claim 1, further comprising forming sidewall spacers on the gate stack with a temperature below 200 degrees Celsius after the amorphorizing step.

8. The method as recited in claim 1, wherein etching the surface includes one of wet etching with NH$_4$OH or baking with HCl to selectively etch the amorphorized portions with respect to the monocrystalline substrate.

9. The method as recited in claim 8, wherein etching the surface includes tuning the etching to increase the selectivity of the etch process.

10. The method as recited in claim 1, wherein epitaxially growing a layer includes in-situ doping the layer during growth of the layer.

11. The method as recited in claim 1, further comprising forming a screen film on areas of the monocrystalline substrate adjacent to the gate stack to adjust a depth of the amorphorizing of the surface.

12. A method for forming a semiconductor device, comprising:
    forming a gate stack on a monocrystalline substrate;
    implanting an inert species to form an amorphous phase of the monocrystalline substrate on a surface of the substrate adjacent to the gate stack and below a portion of the gate stack, an amorphorized region is formed having a controlled depth by adjusting a power of implantation species;
    etching the surface to selectively remove a thickness of the amorphorized region and to form undercuts underneath the gate stack, such that the undercuts are angled, where lower portions of the undercuts extend horizontally farther underneath the gate stack than upper portions of the undercuts; and
    epitaxially growing a layer in the thickness and the undercuts to form an extension region for the semiconductor device.

13. The method as recited in claim 12, wherein the inert species include one of Ge or Xe.

14. The method as recited in claim 12, wherein implanting includes implanting the inert species at an angle to amorphorize material below the gate stack.

15. The method as recited in claim 14, wherein the angle is between about 5 degrees and about 20 degrees relative to a sidewall of the gate stack.

16. The method as recited in claim 12, further comprising forming sidewall spacers on the gate stack with a temperature below 200 degrees Celsius after the implanting step.

17. The method as recited in claim 12, wherein etching the surface includes one of wet etching with NH$_4$OH or baking with HCl to selectively etch the amorphorized region with respect to the monocrystalline substrate.

18. The method as recited in claim 17, wherein etching the surface includes tuning the etching to increase the selectivity of the etch process.

19. The method as recited in claim 12, wherein epitaxially growing a layer includes in-situ doping the layer during growth of the layer.

20. The method as recited in claim 12, further comprising forming a screen film on areas of the monocrystalline substrate adjacent to the gate stack to adjust a depth of the amorphorized region.

\* \* \* \* \*